United States Patent [19]
Ferrer et al.

[11] Patent Number: 6,115,589
[45] Date of Patent: Sep. 5, 2000

[54] SPEECH-OPERATED NOISE ATTENUATION DEVICE (SONAD) CONTROL SYSTEM METHOD AND APPARATUS

[75] Inventors: Enrique Ferrer, Miami; Charles R. Ruelke, Plantation, both of Fla.; Andrew J. Webster, Basingstoke, United Kingdom; Kenneth A. Hansen, Round Rock, Tex.; Rajesh H. Zele, Plantation, Fla.; Kevin B. Traylor, Austin, Tex.

[73] Assignee: Motorola, Inc., Schaumburg, Ill.

[21] Appl. No.: 08/841,242

[22] Filed: Apr. 29, 1997

[51] Int. Cl.[7] .............................. H04B 1/06; H04H 5/00; G10L 21/00
[52] U.S. Cl. ............... 455/249.1; 455/205; 455/212; 455/506; 381/94.1; 704/226
[58] Field of Search ...................... 455/205, 570, 455/232.1, 506, 245.1, 249.1, 250.1, 312, 296, 501; 375/345; 381/94.1, 13; 704/233, 212

[56] References Cited

U.S. PATENT DOCUMENTS

| | | | |
|---|---|---|---|
| 3,851,253 | 11/1974 | Eastmond | 455/212 |
| 4,052,568 | 10/1977 | Jankowski | 704/233 |
| 4,759,071 | 7/1988 | Heide | 381/317 |
| 4,792,991 | 12/1988 | Eness | 455/210 |
| 4,811,404 | 3/1989 | Vilmur et al. | 381/94.3 |
| 4,893,347 | 1/1990 | Eastmond et al. | 455/506 |
| 4,893,349 | 1/1990 | Eastmond et al. | 455/205 |
| 4,918,734 | 4/1990 | Muramatsu et al. | 704/214 |
| 5,036,540 | 7/1991 | Eastmond | 704/226 |
| 5,083,304 | 1/1992 | Cahill | 375/345 |
| 5,226,178 | 7/1993 | Eastmond et al. | 455/23 |
| 5,303,406 | 4/1994 | Hansen et al. | 455/222 |
| 5,384,547 | 1/1995 | Lynk, Jr. et al. | 330/136 |
| 5,440,641 | 8/1995 | Kuusama | 381/71.12 |
| 5,457,811 | 10/1995 | Lemson | 455/67.1 |
| 5,471,187 | 11/1995 | Hansen et al. | 340/146.2 |
| 5,526,530 | 6/1996 | Sueka et al. | 455/212 |
| 5,564,090 | 10/1996 | Beuchamp et al. | 455/220 |
| 5,583,891 | 12/1996 | Espe et al. | 375/346 |
| 5,697,081 | 12/1997 | Lyall, Jr. et al. | 455/249.1 |
| 5,706,356 | 1/1998 | Walden | 381/106 |

*Primary Examiner*—Reinhard J. Eisenzopf
*Assistant Examiner*—Charles N. Appiah
*Attorney, Agent, or Firm*—Andrew S. Fuller

[57] ABSTRACT

A SONAD (110) control system (100) detects a received signal strength (RSSI) for a radio frequency (RF) signal (102), selects a threshold transfer function (400–404) in response thereto, generates a threshold control signal in response to the transfer function, and utilizes the threshold control signal to select the SONAD threshold value. During operation, the control system (100) decreases the attenuation of background noise levels for weak RF signals.

6 Claims, 5 Drawing Sheets

SPEECH-OPERATED NOISE ATTENUATION DEVICE (SONAD) CONTROL SYSTEM METHOD AND APPARATUS

TECHNICAL FIELD

This invention generally relates to frequency modulated (FM) communication systems. The present invention is particularly directed to a speech-operated noise attenuation device (SONAD) that attenuates intersyllabic background noise (noise between syllables) in audio circuits such as those found in the audio output stage of a radio receiver. Specifically, the invention is capable of reproducing natural sounding speech at both high and low radio frequency (RF) signal strength levels.

BACKGROUND

Prior art speech-operated noise attenuation devices (SONAD) attenuate an audio signal in the absence of voice or speech signals to suppress the apparent level of background noise between syllables. These prior art circuits typically provide a degree of intersyllabic noise attenuation which is related to the prevailing noise level in the signal. When background noise levels vary, the noise suppression provided by the prior art SONAD circuits varies as well. In many audio signals, the level of background noise varies over a wide range so that the effectiveness of a prior art SONAD in removing intersyllabic noise will vary significantly. A SONAD that reduces background noise while accommodating changes in the background noise level is also known in the art.

Unfortunately, such prior art SONAD circuits produce a very unnatural sounding speech due to suppression of the background noise when operated under weak RF signal conditions. This is due to fast changes in attenuation, which produces a dramatic contrast between no attenuation and full attenuation. Such behavior is inevitable, since a single threshold point is used in order to achieve the desired degree of noise suppression. Other known SONAD circuits attempt to avoid the aforementioned problems by employing two attenuators in tandem, each having a different threshold point. Such a device is taught and suggested in U.S. Pat. No. 4,893,349 entitled "FM Communication System with Improved Response to Rayleigh-Faded Received Signals," issued Jan. 9, 1990, and assigned to the assignee of the present application. In accordance with the teachings of this prior art SONAD, the attenuation changes more rapidly as the input signal level is reduced. This improved attenuation characteristic tends to minimize speech distortions, since only the lower level speech sounds are significantly attenuated without affecting the higher level speech sounds. Furthermore, the use of separate threshold points more effectively reduces the noise between syllables to produce a better sounding speech than exhibited by prior art SONAD circuits.

Notwithstanding the production of more natural sounding speech accompanied by the use of the SONAD as taught in U.S. Pat. No. 4,893,349, this approach is still characterized by a fast change in attenuation which produces a contrast between no attenuation and full attenuation, in situations such as Rayleigh fading, and is therefore characterized by the production of speech which is still somewhat unnatural in its sound and makeup.

A need, therefore, exists to provide an improved audio noise reduction technique which is capable of reproducing natural sounding speech at both high RF signal strength levels and at low RF signal strength levels typically attributable to Rayleigh fading.

DETAILED DESCRIPTION OF THE PREFERRED EMBODIMENT

Figure 1:
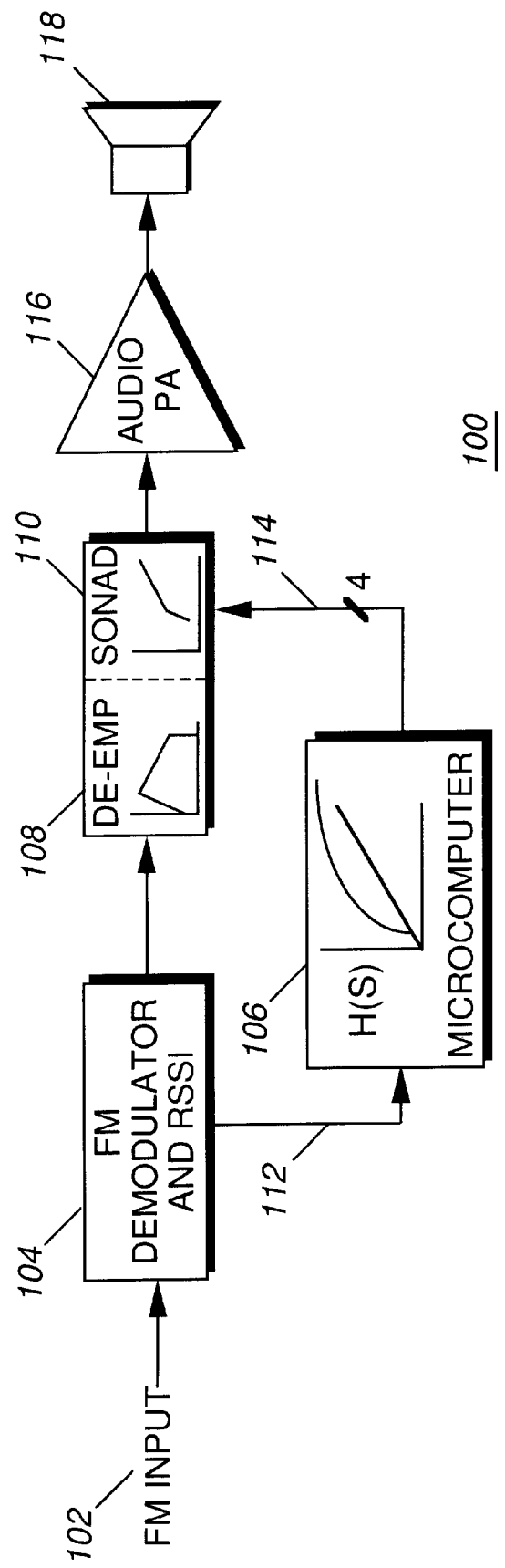
FIG. 1 is a partial block diagram of an FM receiver incorporating the intersyllabic noise reduction technique in accordance with the present invention.

The features of the present invention, which are believed to be novel, are set forth with particularity in the appended claims. The invention, together with further objects and advantages thereof, may best be understood by reference to the following description, taken in conjunction with the accompanying drawings, of which like reference numerals identify like elements.

Referring first to FIG. 1, a partial block diagram of an FM receiver incorporating an audio signal noise reduction technique and circuit in accordance with the present invention is shown. As will be appreciated after review hereof, the device 100 is designed to minimize low-level background noise under strong RF signal conditions. During weak RF signal conditions, the device operates to reduce the attenuation of said signals. Simply stated, the present invention is a SONAD control system methodology and apparatus that operates under weak RF signal conditions to reduces the SONAD threshold level thereby decreasing the background noise attenuation in order to reproduce more natural sounding speech. Conversely, during strong RF signal conditions, methodology and apparatus of the present invention operates to increase the SONAD threshold level thereby maximizing the background noise attenuation.

As depicted in FIG. 1, the receiver 100 employs an FM demodulator 104 that receives a frequency modulated (FM) input signal 102 and employs conventional demodulation techniques to recover the audio portion of the FM input 102. The recovered audio signal is then routed to receiver filtering circuitry, such as the de-emphasis network 108. Device 104 also includes a receive signal strength indicator (RSSI) capable of deriving a signal strength measurement corresponding to the received FM input 102. The value 112 of RSSI once derived is then passed to microcomputer 106. Such devices are well known in the art and will not therefore be discussed in detail herein.

In accordance with the current invention, microcomputer 106 operates to select one of a plurality of transfer curves that may thereafter be used to control or establish a threshold for the SONAD 110. As will be discussed herein in greater detail, each transfer curve is uniquely selected in order to present the SONAD 110 with dynamic threshold information that permits threshold selection or tuning in response to a control signal 114 in order to adjust to particular environmental conditions and thereby maintain the audio quality of RF signals influenced by said environmental conditions. In accordance with the teaching of the present invention, the transfer curves are based upon or are derived as a function of the RF signal strength of the FM input signal 102.

While it is suggested that device 106 is a microcomputer, it will be appreciated by those skilled in the art that other methods are available for implementing this function, without departing from the spirit of the present invention. One such alternative is to employ a translinear circuit or a plurality of translinear circuits capable of providing any number of transfer function curves.

The overall system architecture of FIG. 1 is designed to minimize low level background noise during strong RF signal conditions, while attempting to reproduce natural sounding speech during weak RF signal conditions. This is accomplished through the use of a SONAD 110 with unity gain for recovered audio above a predefined threshold and providing for a 2:1 reduction in voltage levels for signals falling below said threshold. As will be appreciated, the SONAD 110 may be incorporated into an Application Specific Integrated Circuit (ASIC) that is positioned after the standard receiver audio filtering topology but before the audio power amplifier 116 and speaker 118. The unity gain threshold of SONAD 110 will be real time programmable through a control voltage 114 derived from microcomputer 106 in response to a RSSI in order to achieve optimum psycho-acoustic effects. The transfer function H(s) can be realized by hardware or software, and in the broadest applications can itself be user selectable dependent on operating environments (i.e.: fading frequency, user preferences). The unity gain threshold level of the SONAD 110 is initially set to a percentage of the received signal maximum system deviation and will be programmable using a 4 bit (16 level) variable voltage reference. The threshold programming range will be from approximately 2 percent (%) to 30 percent (%) of maximum system deviation.

In effect, the SONAD and SONAD control system of FIG. 1 operates to decrease the background noise attenuation under weak RF signal conditions in order to reproduce more natural sounding speech, while increasing the background noise attenuation under strong RF signal conditions to reduce the level of background noise.

Figure 2:
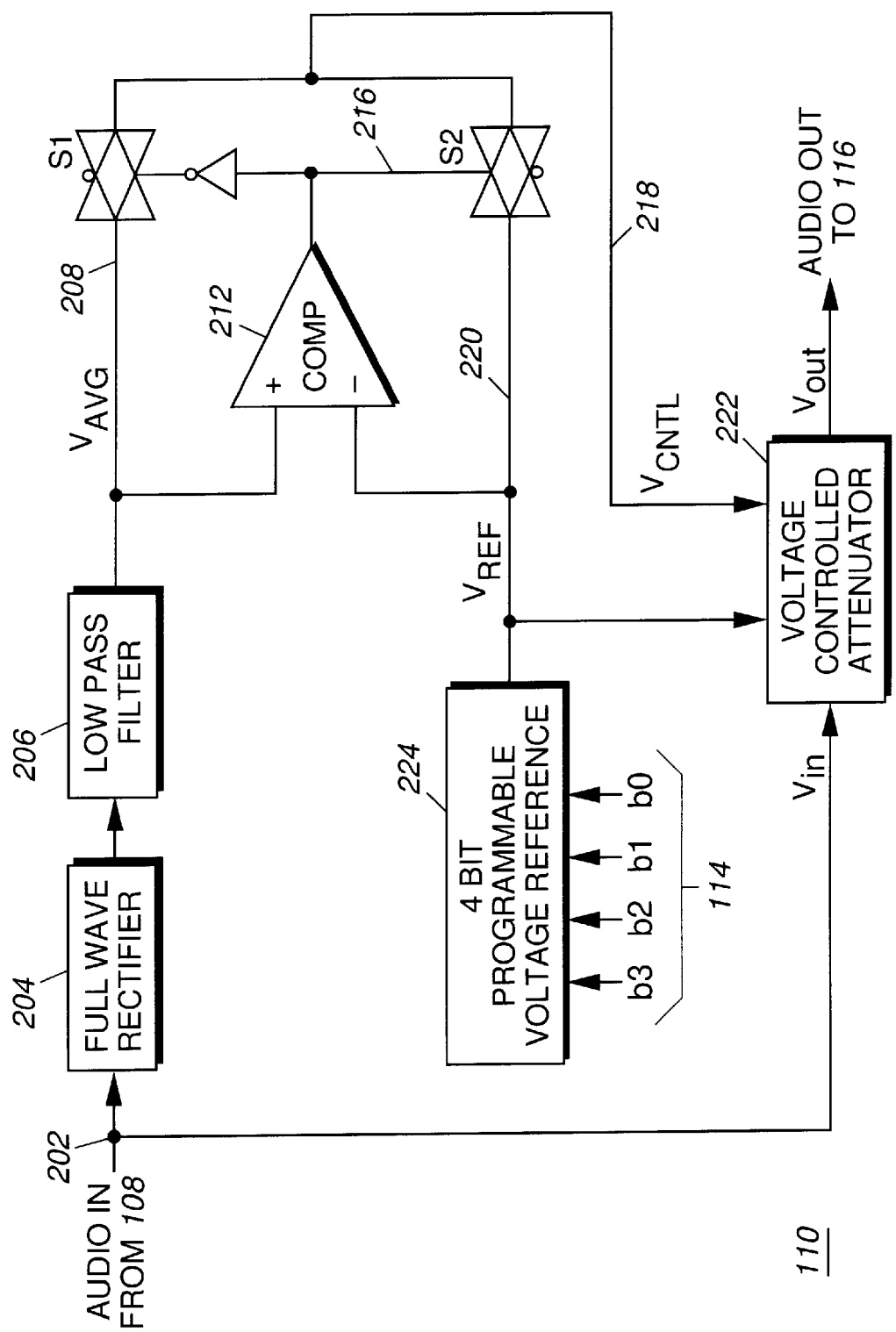
FIG. 2 is a detailed block diagram of the speech operated noise attenuation device (SONAD) of FIG. 1.

FIG. 2 is a detailed block diagram of a preferred embodiment of the SONAD 110 of FIG. 1. As depicted, the SONAD 110 receives an audio input signal 202 from the de-emphasis filter 108. The audio input signal 202, also defined as $V_{in}$, is rectified by full wave rectifier 204 and filtered by low pass filter 206 to produce a direct current (DC) voltage signal $V_{AVG}$ 208. In accordance with the preferred embodiment, low pass filter 206 is a 1 pole filter having a cut-off frequency of approximately 10 hertz (Hz).

The DC signal $V_{AVG}$ 208 output from filter 206 is supplied to comparator 212. As shown, the comparator 212 compares the DC signal $V_{AVG}$ 208 to a reference signal $V_{REF}$ 220. As depicted, the reference signal $V_{REF}$ 220 is supplied by a programmable voltage reference 224. In accordance with the preferred embodiment, the programmable voltage reference 224 is a 4 bit programmable voltage reference that receives control signal 114 from microcomputer 106 of FIG. 1 and adjusts the voltage level of $V_{REF}$ 220 in response thereto. $V_{REF}$ 220 is then compared to $V_{AVG}$ 208 by the comparator 212.

During operation, when $V_{AVG}$ 208 is greater in amplitude than $V_{REF}$ 220, the switch control signal 216 operates to close S2. Under this circumstance, the inputs to voltage controlled attenuator 222; namely, $V_{REF}$ 220 and $V_{CNTL}$ 218 will have identical amplitudes. Conversely, when $V_{REF}$ 220 is greater in amplitude than $V_{AVG}$ 208, the switch control signal 216 operates to close S1. Under this circumstance, the inputs to voltage controlled attenuator 222; namely, $V_{REF}$ 220 and $V_{CNTL}$ 218 have differing amplitudes. In response to these inputs, the voltage controlled attenuator 222 will attenuate the audio input signal $V_{in}$ 202 in accordance with the following relationship.

$$\frac{V_{OUT}}{V_{in}} = \frac{V_{CTRL}}{V_{REF}}$$

Based upon the foregoing, it will be appreciated by those skilled in the art that in the presence of a speech signal $V_{AVG}$ 208 is greater in amplitude than $F_{REF}$ 220. Under this circumstance, the inputs to voltage controlled attenuator 222; namely, $V_{REF}$ 220 and $V_{CNTL}$ 218 have identical amplitudes and no attenuation is supplied by the voltage controlled attenuator 222. Conversely, during pauses in the speech signal, $V_{REF}$ 220 is greater in amplitude than $V_{AVG}$ 208. Under this circumstance, the inputs to voltage controlled attenuator 222; namely, $V_{REF}$ 220 and $V_{CNTL}$ 218 have differing amplitudes. In response, the voltage controlled attenuator will operate to attenuate the audio input $V_{in}$ 202 to increase the background noise attenuation prior to delivery to the audio amplifier 116 of FIG. 1.

Figure 3:
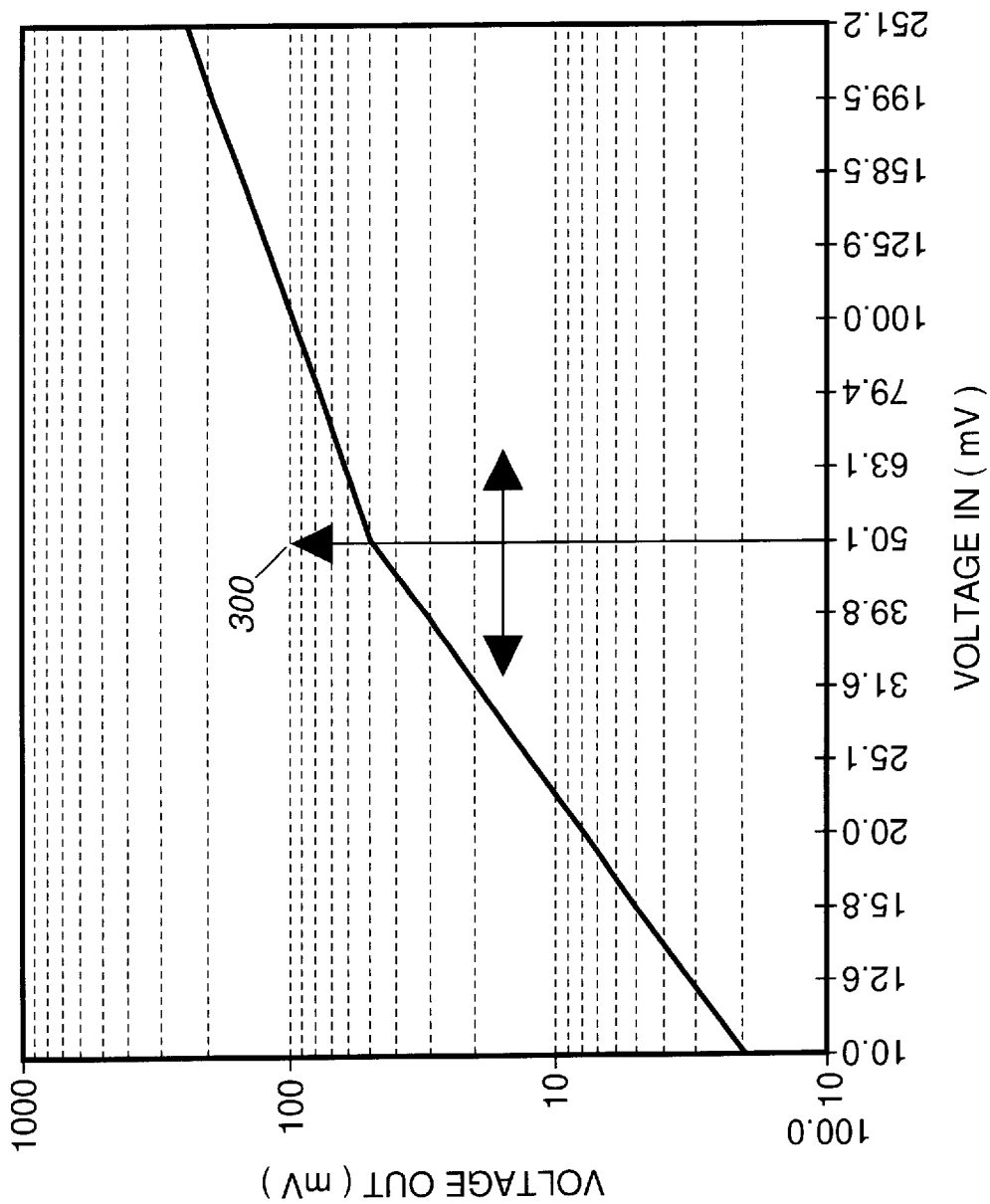
FIG. 3 is a graph illustrating the input/output characteristics of the SONAD device of FIG. 2.

An illustration of a preferred SONAD 110 characteristic response is shown in FIG. 3. Reducing the SONAD 110 threshold during weak RF signal conditions minimizes "audio pumping" generated in the presence of high demodulator noise. Thus, the tunabililty of the threshold 300 accommodates noise reduction during strong RF signal conditions, while mitigating noise pumping effects resulting from a high SONAD 110 threshold in weak RF signal conditions. It is also evident that the need for audio processing in weak RF signal conditions is significantly reduced given that any undesired hum or tonal products present at the demodulator 104 output will be masked by discriminator noise.

One area of concern is the selection of the nominal setting of the SONAD 110 threshold 300. This threshold should be selected to prevent the unacceptable reduction in audio level that occurs as the distance between the transmitter microphone (not shown) and the user increases (lower input deviation level). This condition can be eliminated if the SONAD 110 threshold 300 is set sufficiently low such that deviations at increased distances from the microphone result in audio input voltage levels that are at or above the SONAD 110 threshold 300. Notwithstanding, the SONAD 110 threshold 300 must also be high enough to provide for sufficient noise reduction in nominal operating conditions. Preliminary evaluations have shown that the unity gain threshold can be set high enough to achieve worst case hum and noise levels of −50 decibels (dB), while receive audio overdrive settings of >6 dB provide for sufficient dynamic range to compensate for any reduction in volume level via volume control.

Figure 4:
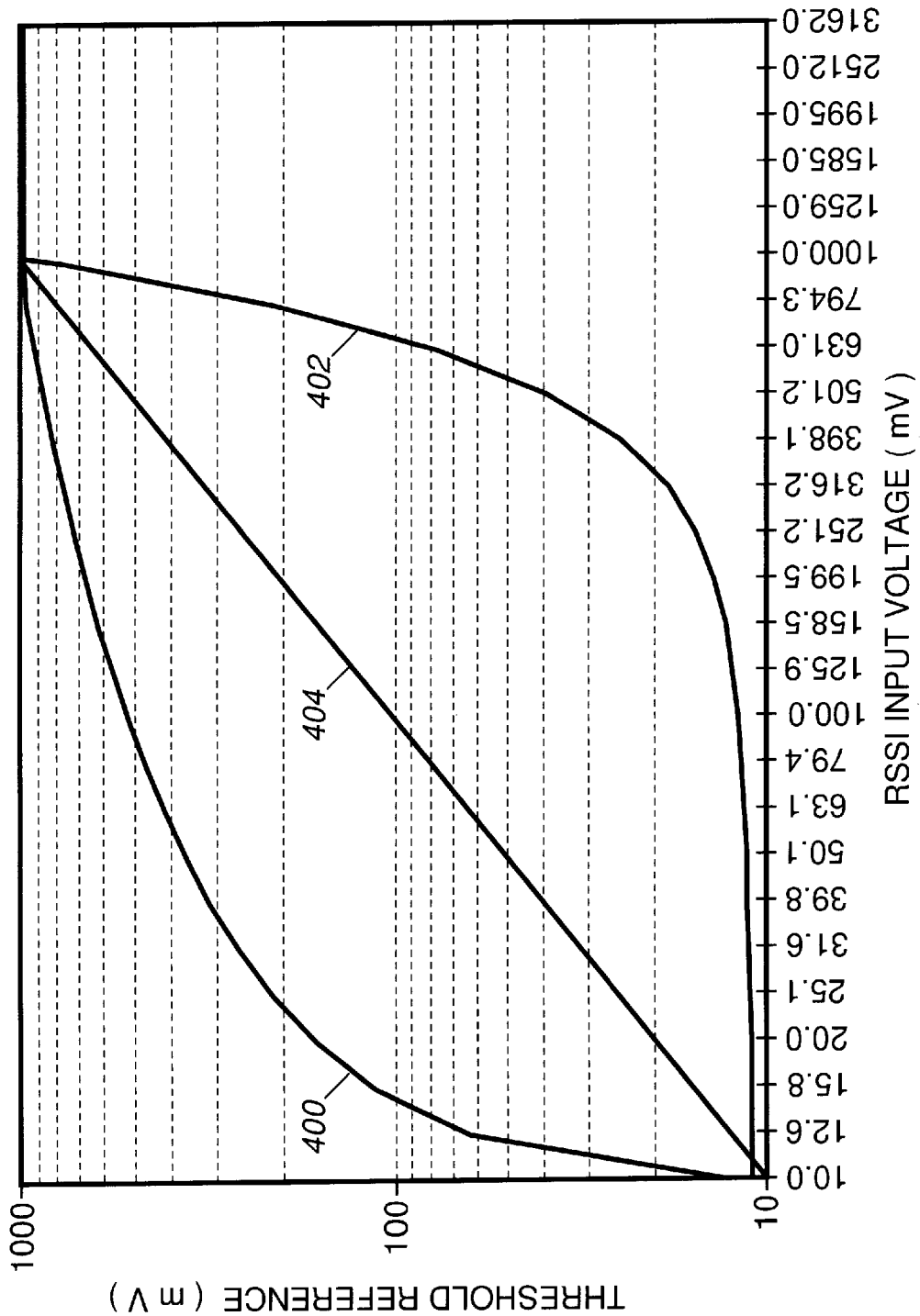
FIG. 4 is a graph illustrating a set of proposed transfer curves that may be used to control the threshold of the SONAD of FIG. 2.

A family of proposed transfer curves used in accordance with the preferred embodiment are shown in FIG. 4. Each curve offers a unique advantage in tuning the SONAD 110 threshold 300 to adjust to particular environmental conditions. For example, during nominal operating conditions where strong RF signals (<−30 dB Quieting) are encountered, it is anticipated that the response of choice will be proportional to $20Log(V_{in})$ as represented by curve 400. This provides for moderate reduction of the threshold for signal levels <−20 dB Quieting, while quickly reducing the threshold for very weak signal conditions where discriminator noise can contribute to audio pumping.

In environments where strong RF signal conditions are prevalent, but fading is frequently encountered, it is anticipated that the response of choice will be proportional to Exp($V_{in}$) as represented by curve 402. This response maximizes the noise suppression in nominal strong signal conditions, while quickly reducing the threshold during weak signal conditions to eliminate marginal pumping effects during a fade. In effect, the device of the present invention decreases the SONAD threshold i.e., reduces attenuation as RSSI decreases.

In accordance with the preferred embodiment, the linear response, characterized by curve 404, and further described as ($V_{in}=V_{out}$), will be selected as a default condition and used when the operating environment is stable or unknown. Notwithstanding the above selections, it will be appreciated by those skilled in the art that several other arithmetic functions can and may be used to control the SONAD 110 threshold without departing from the spirit of the present invention. Such other available alternatives include, but are not limited to non-linear responses.

Figure 5:
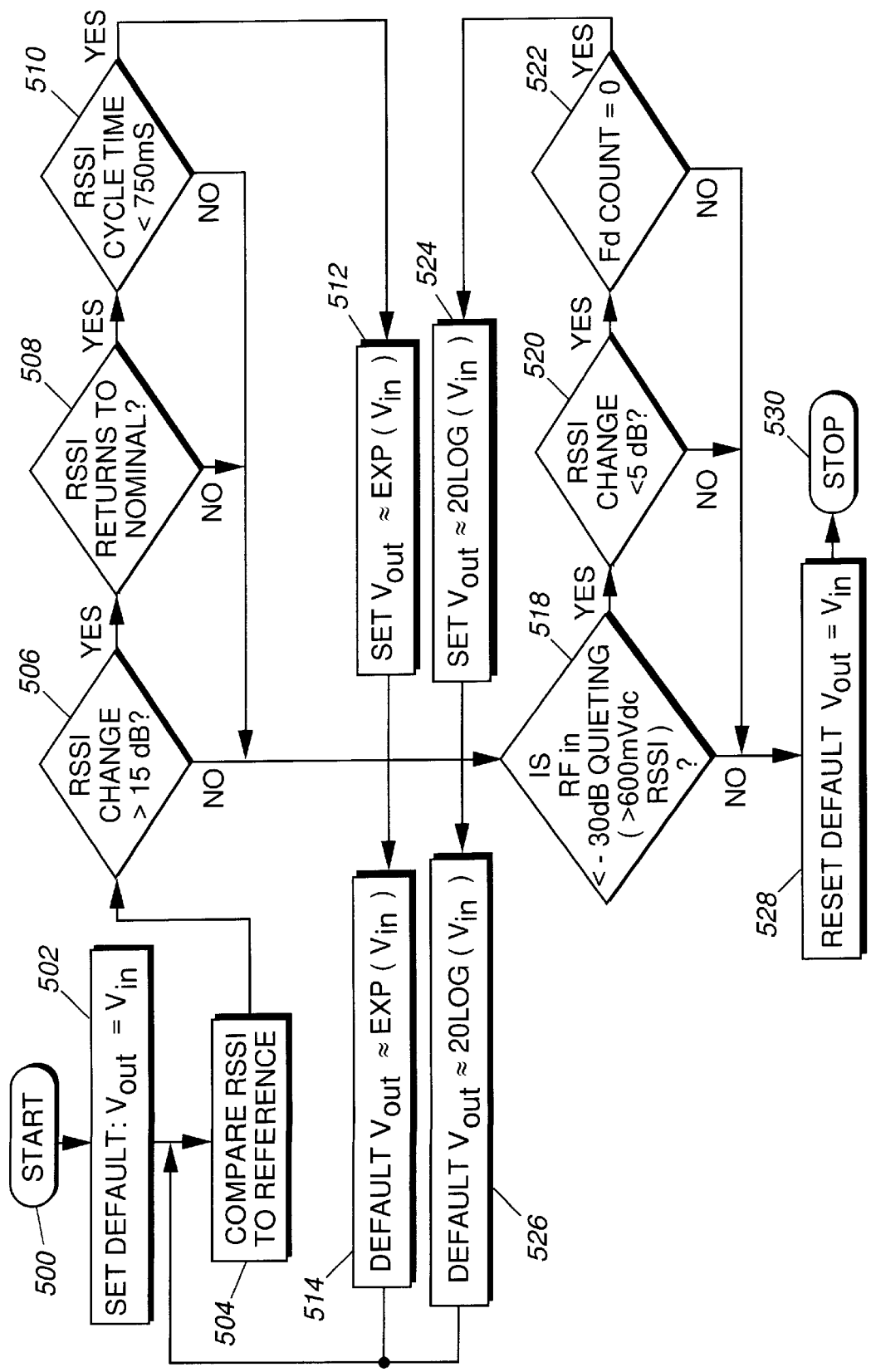
FIG. 5 is a flow chart diagram of the steps performed by the receiver of FIG. 1 in order to practice the noise reduction technique of the present invention.

FIG. 5 is a high level flow chart diagram of the steps performed by the receiver of FIG. 1 under the control of a controller like microcomputer 106 of FIG. 1, in order to practice the noise reduction technique of the present invention. Commencing at start block 500 flow proceeds to block 502 where the function select operation is set to default such that the linear transfer function 404 of FIG. 4 is initially selected. From block 502, flow proceeds to block 504 where the received signal strength of RF input signal 102 is detected and compared to a reference. At blocks 506–510 a test is performed to detect a momentary RSSI change of more than 15 decibels (dB) lasting less than 750 milliseconds (mS). If so, it is assumed at block 512 that the device has encountered an environment where strong signal conditions are prevalent, but fading is frequently encountered. In accordance with the preferred embodiment, the response of choice under such conditions is proportional to Exp($V_{in}$) as represented by curve 402 of FIG. 4. Assuming RSSI has not changed by more that 15 dB at block 506 or that it changed by more than 15 dB but for longer than 750 ms, flow proceeds to blocks 518–522 where a test is performed to determine whether strong RF signal conditions (<–30 dB Quieting) exist. If so, at block 524, microcomputer 106 of FIG. 1 will select from memory (not shown) a transfer response proportional to 20Log($V_{in}$) as represented by curve 400. As will be appreciated, this response will provide for moderate reduction of the threshold for signal levels <–30 dB Quieting, while quickly reducing the threshold for very weak RF signal conditions where discriminator noise can contribute to audio pumping. Otherwise, flow will proceed from block 518 to block 528 where the linear response exhibited by the curve 404 of FIG. 4 is selected for use.

While the preferred embodiments of the invention have been illustrated and described, it will be clear that the invention is not so limited. Numerous modifications, changes, variations, substitutions and equivalents will occur to those skilled in the art without departing from the spirit and scope of the present invention as defined by the appended claims. For example, the SONAD 110 can also be completely bypassed via the use of selectable T-gate, such as switches S1 and S2 as mentioned in FIG. 2 for full companding compatibility.

What is claimed is:

1. A method for selecting a threshold value for a speech operated noise attenuation device (SONAD) comprising the steps of:

detecting a signal to noise ratio (SNR) for a signal;

selecting a transfer function, from a plurality of transfer functions, in response to the SNR;

generating a control signal in response to the transfer function; and utilizing the control signal to select the SONAD threshold value from among a range of threshold values.

2. A method for adjusting a threshold control signal value for a speech operated noise attenuation device (SONAD) comprising the steps of:

detecting a received signal strength (RSSI) for a radio frequency (RF) signal;

comparing the RSSI to a reference; and decreasing the threshold control signal value when RSSI is less than the reference.

3. A speech operated noise attenuation device (SONAD) control system comprising:

a signal strength detector for detecting a received signal strength (RSSI) for a radio frequency (RF) signal;

a controller, coupled to the signal strength detector, for selecting one of a plurality of transfer functions in response to the RSSI; and a SONAD, coupled to the controller, for receiving a control signal that alters the SONAD threshold value in response to the selected transfer function.

4. The device of claim 3 wherein the SONAD threshold value decreases as RSSI decreases.

5. The device of claim 3 wherein the SONAD attenuation decreases as RSSI decreases.

6. A speech operated noise attenuation device (SONAD) control system comprising:

a signal strength detector for detecting a received signal strength (RSSI) for a radio frequency (RF) signal;

a controller, coupled to the signal strength detector, for selecting one of a plurality of transfer functions in response to the RSSI; and a SONAD, coupled to the controller, for receiving a control signal that alters the SONAD threshold value in response to the selected transfer function;

wherein the plurality of transfer functions are selected from the group consisting of:

exponential responses; logarithmic responses; linear responses; and non-linear responses.

* * * * *